(12) United States Patent  
Yen et al.

(10) Patent No.: US 11,961,831 B2
(45) Date of Patent: Apr. 16, 2024

(54) ELECTRONIC PACKAGE, SEMICONDUCTOR PACKAGE STRUCTURE, AND METHOD FOR MANUFACTURING THE SEMICONDUCTOR PACKAGE STRUCTURE

(71) Applicant: Advanced Semiconductor Engineering, Inc., Kaohsiung (TW)

(72) Inventors: You-Lung Yen, Taoyuan (TW); Bernd Karl Appelt, Holly Springs, NC (US)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 173 days.

(21) Appl. No.: 17/408,297

(22) Filed: Aug. 20, 2021

(65) Prior Publication Data

US 2023/0058358 A1  Feb. 23, 2023

(51) Int. Cl.
*H01L 25/18* (2023.01)
*H01L 21/56* (2006.01)
*H01L 23/00* (2006.01)
*H01L 23/31* (2006.01)
*H01L 23/498* (2006.01)
(Continued)

(52) U.S. Cl.
CPC .............. *H01L 25/18* (2013.01); *H01L 21/56* (2013.01); *H01L 23/3107* (2013.01); *H01L 23/49811* (2013.01); *H01L 23/5383* (2013.01); *H01L 23/5384* (2013.01); *H01L 23/5386* (2013.01); *H01L 24/48* (2013.01); *H01L 25/50* (2013.01); *H01L 2224/48141* (2013.01); *H01L 2224/48227* (2013.01)

(58) Field of Classification Search
CPC ........ H10B 80/00; H10K 19/00; H10K 39/10; H10K 59/90; H10K 59/95; H10K 65/00; H01L 25/18; H01L 21/56; H01L 23/3107; H01L 23/49811; H01L 23/5383; H01L 23/5386; H01L 24/48; H01L 25/50; H10N 19/00; H10N 39/00; H10N 59/00; H10N 69/00; H10N 79/00; H10N 89/00
USPC .......................................................... 257/668
See application file for complete search history.

(56) References Cited

U.S. PATENT DOCUMENTS

| 2002/0089050 A1* | 7/2002 | Michii ................... H01L 24/06 257/738 |
| 2003/0134451 A1 | 7/2003 | Chen |
| 2020/0168579 A1* | 5/2020 | Sato ..................... H01L 25/043 |

FOREIGN PATENT DOCUMENTS

JP  3165959 B2  5/2001

* cited by examiner

*Primary Examiner* — Jasmine J Clark
(74) *Attorney, Agent, or Firm* — FOLEY & LARDNER LLP

(57) ABSTRACT

An electronic package, a semiconductor package structure and a method for manufacturing the same are provided. The electronic package includes a carrier, a first electronic component, an electrical extension structure, and an encapsulant. The carrier has a first face and a second face opposite to the first face. The first electronic component is adjacent to the first face of the carrier. The electrical extension structure is adjacent to the first face of the carrier and defines a space with the carrier for accommodating the first electronic component, the electrical extension structure is configured to connect the carrier with an external electronic component. The encapsulant encapsulates the first electronic component and at least a portion of the electrical extension structure.

20 Claims, 15 Drawing Sheets

(51) Int. Cl.
*H01L 23/538* (2006.01)
*H01L 25/00* (2006.01)

ELECTRONIC PACKAGE, SEMICONDUCTOR PACKAGE STRUCTURE, AND METHOD FOR MANUFACTURING THE SEMICONDUCTOR PACKAGE STRUCTURE

BACKGROUND

1. Field of the Disclosure

The present disclosure relates to an electronic package, semiconductor package structure and a method of manufacturing the same, and in particular, to a semiconductor package structure including an electrical extension structure.

2. Description of the Related Art

In order to scale down semiconductor package structures, many techniques have been developed. For example, the single-side molding technique has been developing into a dual-side molding technique, and the single chip package technique has been developing into a multi-chip package technique, all of which are the result of scaling down the semiconductor package structures. In current window ball-grid arrays (WBGA) package structures, a bonding wire is used to connect a pad on the die to a substrate through a window opening in order to reduce the length of the conducting path and the resistance of signal transmission. However, the current WBGA package structures support only a single electronic component, limiting the variety of functions of the package structure. Although stacking die structure can achieve more functions, the entire thickness of the package structure is thereby increased. Further, stacking die structure cannot be electrically connected to the carrier by merely one window opening, and mold chase need to be customized to carefully encapsulate the window opening which increases the production cost.

SUMMARY

In some embodiments, an electronic package includes a carrier, a first electronic component, an electrical extension structure, and an encapsulant. The carrier has a first face and a second face opposite to the first face. The first electronic component is adjacent to the first face of the carrier. The electrical extension structure is adjacent to the first face of the carrier and defines a space with the carrier for accommodating the first electronic component, the electrical extension structure is configured to connect the carrier with an external electronic component. The encapsulant encapsulates the first electronic component and at least a portion of the electrical extension structure.

In some embodiments, a semiconductor package structure includes a carrier, a first electronic component, a second electronic component, a first opening, a first bonding wire, and a second bonding wire. The carrier has a first face and a second face opposite to the first face. The first face is configured to connect the carrier with an external circuit structure. The first electronic component is adjacent to the first face of the carrier. The second electronic component is adjacent to the second face of the carrier. The first opening is in the carrier, and connects the first face and the second face. The first bonding wire passes the first opening and has a first end bonded to the first electronic component and a second end bonded to the second electronic component. The second bonding wire passes the first opening and has a first end bonded to the first electronic component and a second end bonded to the carrier.

In some embodiments, a method for manufacturing a semiconductor package structure includes: providing a carrier having a first face and a second face opposite to the first face, the carrier defining a first opening connecting the first face and the second face of the carrier; forming an electrical extension structure from the first face of the carrier; attaching a first electronic component from the first face of the carrier; and encapsulating the first electronic component and the electrical extension structure by a molding operation.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
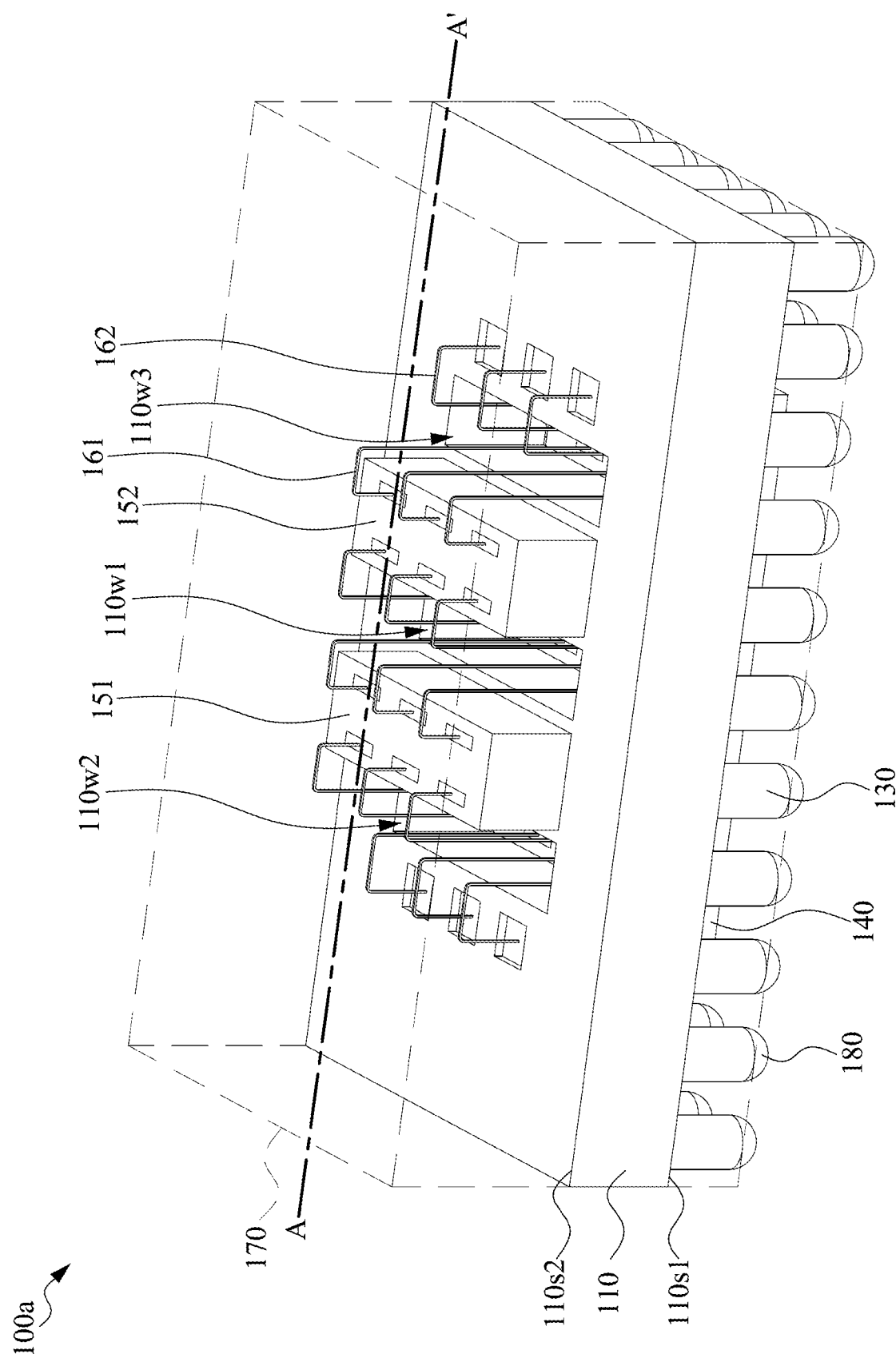
FIG. 1A illustrates a perspective view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some embodiments, a problem that the current WBGA package structures face is that they can support only a single electronic component, limiting the variety of functions of the package structure. Further, a customized mold is required to encapsulate the package structure in order to prevent solder balls from being encapsulated, increasing the cost of manufacturing the WBGA package structures.

In the present disclosure, two or more electronic components can be attached to opposite sides of a carrier and can be interconnected by bonding wires passing openings of the carrier. Further, forming an electrical extension structure, with a thickness greater than that of the electronic component, on one side of the carrier can alter the steps of forming solder balls and forming an encapsulant so that a general mold can be used to encapsulate the WBGS package structure without facing the problem of solder balls being encapsulated.

FIG. 1A illustrates a perspective view of an example of a semiconductor package structure 100a according to some embodiments of the present disclosure.

In some embodiments, the semiconductor package structure 100a may include a WBGA package structure. In some embodiments, the semiconductor package structure 100a may include a carrier 110, electrical extension structures 130, an electronic component 140, an electronic component 151, an electronic component 152, bonding wires 161, bonding wires 162, an encapsulant 170, and conductive terminals 180. In some embodiments, the semiconductor package structure 100a is an electronic package.

As shown in FIG. 1A, the carrier 110 may have a face 110s1 and a face 110s2 opposite to the face 110s1. The face 110s1 is configured to connect the carrier with an external circuit structure, such as the electrical extension structure 130, the conductive terminal 180, a circuit board (not shown) or other suitable structures. In some embodiments, the carrier 110 may define openings 110w1, 110w2, and 110w3. Each of the openings 110w1, 110w2, and 110w3 may connect the faces 110s1 and 110s2. The electrical extension structure 130 may extend and protrude from the face 110s1 of the carrier 110. The electronic component 140 may be disposed on the face 110s1 of the carrier 110 and surrounded by the electrical extension structure 130. The electronic components 151 and 152 may be disposed on the face 110s2 of the carrier 110. In some embodiments, each of the bonding wires 161 and 162 may pass one of the openings 110w1, 110w2, and 110w3. The encapsulant 170 may cover the faces 110s1 and 110s2 of the carrier 110. The encapsulant 170 may encapsulate the electrical extension structure 130, the electronic components 140, 151, and 152 as well as the bonding wires 161 and 162. It should be noted that in order to illustrate the elements inside the encapsulant 170 clearly, the encapsulant 170 is presented with dotted lines. The conductive terminal 180 may be disposed on the electrical extension structure 130 and exposed from the encapsulant 170.

Figure 1B:
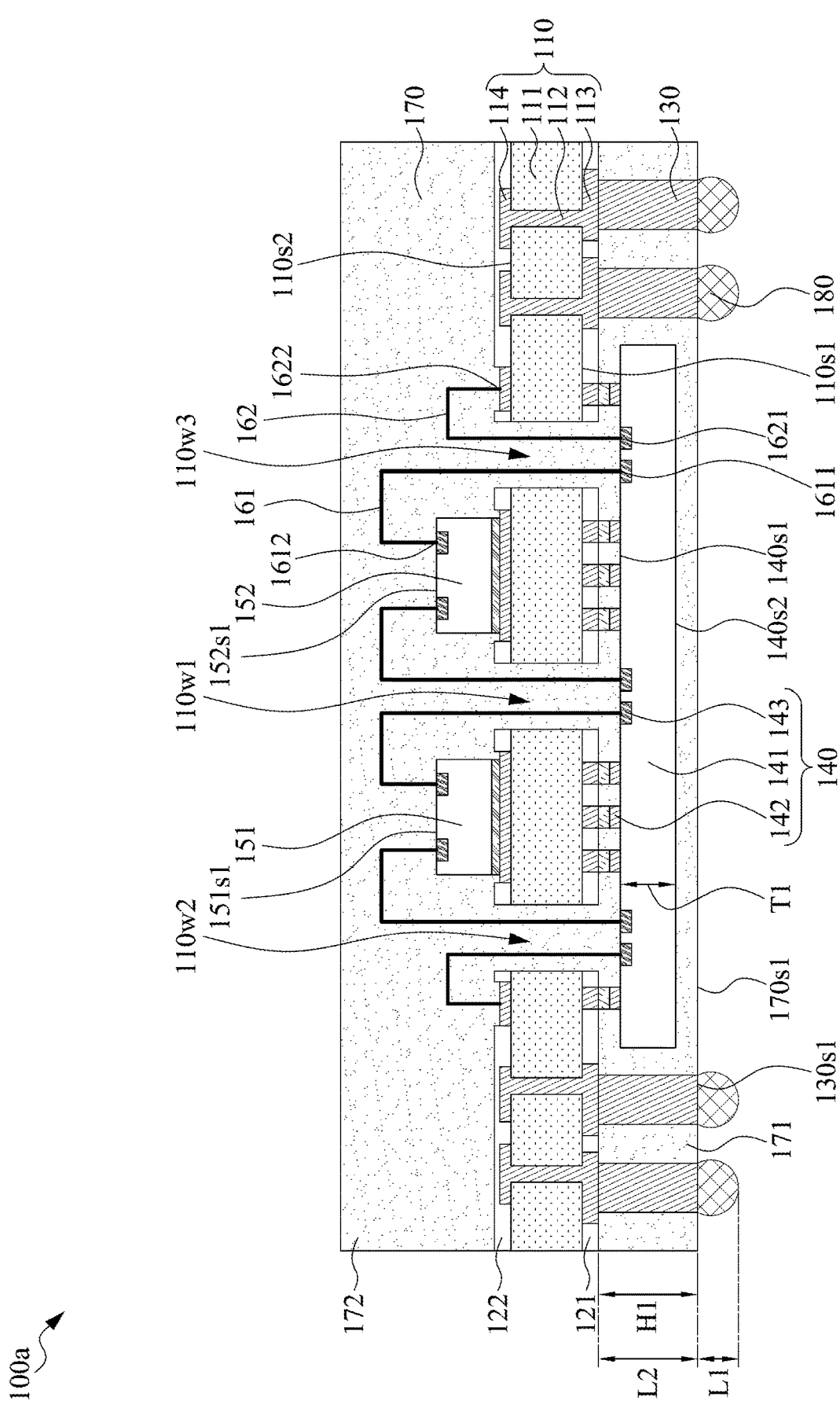
FIG. 1B illustrates a cross-sectional view along the line A-A' of the semiconductor package structure shown in FIG. 1A according to some embodiments of the present disclosure.

FIG. 1B illustrates a cross-sectional view along the line A-A' of the semiconductor package structure 100a shown in FIG. 1A according to some embodiments of the present disclosure.

In some embodiments, the carrier 110 may include a wired substrate. The carrier 110 may include a dielectric structure 111, a via 112, a pattern 113 and a pattern 114. The dielectric structure 111 may include Prepreg (PP), Ajinomoto build-up film (ABF) or other suitable materials. In some embodiments, a resin material used in the core substrate may be a fiber-reinforced resin so as to strengthen the dielectric structure 111, and the reinforcing fibers may be, without limitation, glass fibers or Kevlar fibers (aramid fibers). The via 112 may include one or more segments traversing the carrier 110 and extend between the faces 110s1 and 110s2. Although not illustrated in FIG. 1B, one or more conductive traces can be embedded in the dielectric structure 111 of the carrier 110 and electrically connected with the via 112 and patterns 113, 114. In some embodiments, the via 112 can be a through via. The via 112 may electrically connect the patterns 113 and 114. The pattern 113 may be disposed on the face 110s1 of the carrier 110. The pattern 113 may be in contact with and electrically connected to the electrical extension structure 130. The pattern 114 may be disposed on the face 110s2 of the carrier 110. The via 112, pattern 113, and pattern 114 may include conductive material, such as metal or other suitable materials. For example, the via 112, pattern 113, and pattern 114 may include copper (Cu), silver (Ag), aluminum (Al), gold (Au), or an alloy thereof.

In some embodiments, the semiconductor package structure 100a may further include dielectric layers 121 and 122. The dielectric layer 121 may be disposed on the face 110s1. The pattern 113 may be embedded in the dielectric layer 121 and has a surface exposed from the dielectric layer 121. The dielectric layer 122 may be disposed on the face 110s2 of the carrier 110. A portion of the pattern 114 may be exposed from the dielectric layer 122. The dielectric layers 121 and 122 may include dielectric materials, such as solder resist or other suitable materials.

The electrical extension structure 130 may be disposed on the face 110s1 of the carrier 110. The electrical extension structure 130 may be encapsulated by the encapsulant 170. The electrical extension structure 130 may be configured to electrically connect the pattern 113 of the carrier 110 to other conductive elements, such as the conductive terminal 180. In some embodiments, the electrical extension structure 130 may include a conductive pillar. The electrical extension structure 130 may include conductive material, such as metal or other suitable materials. For example, the electrical extension structure 130 may include Cu, Ag, Al, Au, or an alloy thereof. The electrical extension structure 130 may have a surface 130s1 spaced apart from the face 110s1 of the carrier 110. In some embodiments, the electrical extension structure 130 may define a space with the carrier 110 for accommodating the first electronic component 140. In some embodiments, the electrical extension structure 130 may be configured to electrically connect an external electronic component (not shown). In some embodiments, the external electronic component may include a circuit board or other suitable electronic components.

The electronic component 140 is adjacent to or at the face 110s1 of the carrier 110. In some embodiments, the electronic component 140 may be flip chip bonded to the face 110s1. In some embodiments, the electronic component 140 may be a wire-bondable die. The electronic component 140 may have an active surface 140s1 facing the carrier 110 and a backside surface 140s2 opposite to the active surface 140s1. The electronic component 140 may include a semiconductor die or a chip, such as a signal processing die (e.g., digital signal processing (DSP) die), a memory die (e.g., dynamic random access memory (DRAM) die, static random access memory (SRAM) die, etc.), a logic die (e.g., application processor (AP), system-on-a-chip (SoC), central processing unit (CPU), graphics processing unit (GPU), microcontroller, etc.), a power management die (e.g., power management integrated circuit (PMIC) die), a radio frequency (RF) die, a sensor die, a micro-electro-mechanical-system (MEMS) die, a front-end die (e.g., analog front-end (AFE) dies) or other active components. In some embodiments, the electronic component 140 may include a plurality of transistors, diodes, or other active components. The transistor may include bipolar junction transistor, MOSFET, JFET or other transistors. The diode may include a Zener diode, photodiode, Schottky diode or other diodes. The electronic component 140 may have a thickness T1. In some embodiments, the thickness T1 is less than a height H1 of the electrical extension structure 130. In some embodiments, the electronic component 140 may be vertically overlapping the opening 110w1. In some embodiments, the electronic component 140 may be vertically overlapping the opening 110w2 or 110w3.

The electronic component 140 may include a substrate 141, terminals 142, and 143. The substrate 141 may be a semiconductor substrate. The substrate 141 may include silicon or germanium in a single crystal form, a polycrystalline form, or an amorphous form. The terminal 142 may be disposed on the active surface 140s1 of the electronic component 140 and electrically connected to circuits of the carrier 110. The terminal 142 may include, for example, solder balls. The terminal 143 may be configured to electrically connect the bonding wire 161 or 162. The terminal 143 may be embedded in or protrude from the substrate 141. The terminal 143 may include, for example, a conductive pad.

The electronic components 151 and 152 are adjacent to or at the face 110s2 of the carrier 110. In some embodiments, the electronic components 151 may have an active surface 151s1 facing away from the carrier 110. In some embodiments, the electronic components 152 may have an active surface 152s1 facing away from the carrier 110. In some embodiments, the electronic components 151 and 152 may be arranged side-by-side. Each of the electronic components 151 and 152 may be attached to the carrier 110 through a die attach film (DAF). Each of the electronic components 151 and 152 may include a semiconductor die or a chip, such as a memory die (e.g., dynamic random access memory (DRAM) die, static random access memory (SRAM) die, etc.), a signal processing die (e.g., digital signal processing (DSP) die), a logic die (e.g., application processor (AP), system-on-a-chip (SoC), central processing unit (CPU), graphics processing unit (GPU), microcontroller, etc.), a power management die (e.g., power management integrated circuit (PMIC) die), a radio frequency (RF) die, a sensor die, a micro-electro-mechanical-system (MEMS) die, a front-end die (e.g., analog front-end (AFE) dies) or other active components. In some embodiments, the electronic component 140 may be different from the electronic component 151 or 152. For example, the electronic component 140 is a signal processing die, and the electronic component 151 or 152 is a memory die. In some embodiments, the electronic component 140 may have a size greater than that of the electronic component 151 or 152. In some embodiments, a width of the electronic component 140 is greater than that of the electronic component 151 or 152.

The bonding wire 161 may be configured to electrically connect the electronic components 140 and 151 or connect the electronic components 140 and 152. In some embodiments, the bonding wire 161 may pass one of the openings 110w1, 110w2, and 110w3. In some embodiments, the bonding wire 161 may include an end 1611 bonded to the terminal 143 of the electronic component 140 and an end 1612 bonded to the electronic component 151 or 152.

The bonding wire 162 may be configured to electrically connect the carrier 110 and the electronic component 140. In some embodiments, the bonding wire 162 may pass one of the openings 110w2 and 110w3. In some embodiments, the bonding wire 162 may include an end 1621 bonded to the terminal 143 of the electronic component 140 and an end 1622 bonded to the pattern 114 of the carrier 110.

The encapsulant 170 may encapsulate the electrical extension structure 130, the electronic components 140, 151 and 152 as well as the bonding wires 161 and 162. The encapsulant 170 may fill or be disposed in the openings 110w1, 110w2, and 110w3 of the carrier 110. The encapsulant 170 may include insulation or dielectric material. In some embodiments, the encapsulant 170 may include molding material, such as a Novolac-based resin, an epoxy-based resin, a silicone-based resin, or other another suitable encapsulant. Suitable fillers may also be included, such as powdered $SiO_2$. The encapsulant 170 may have a surface 170s1 facing away from the carrier 110. In some embodiments, the surface 170s1 of the encapsulant 170 is substantially coplanar or aligned with the surface 130s1 of the electrical extension structure 130. In some embodiments, the backside surface 140s2 of the electronic component 140 may be fully covered by the encapsulant 170. In some embodiments, the encapsulant 170 may include a portion 171 (or a bottom portion) encapsulating the electronic component 140 and the electrical extension structure 130. The encapsulant 170 may include a portion 172 (or a top portion) encapsulating the electronic components 151 and 152. In some embodiments, a width of the portion 171 may be substantially equal to that of the portion 172.

The conductive terminal 180 may be electrically connected to the electrical extension structure 130. The conductive terminal 180 may be exposed from the surface 170s1 of the encapsulant 170. The conductive terminal 180 may include, for example, a solder ball (e.g., Sn ball). In some embodiments, the conductive terminal 180 may be disposed at a first horizontal level L1, the electronic component 140 may be disposed at a second horizontal level L2, and the first horizontal level L1 is different from the second horizontal level L2. That is, the electronic component 140 may be free from laterally overlapping the conductive terminal 180.

The embodiments of the present disclosure provide a carrier 110 with one or more openings through which the bonding wire 161 (or 162) passes. The bonding wire 161 (or 162) may electrically connect two electronic components that are disposed on two opposite sides of the carrier 110, thereby reducing the thickness of the semiconductor package structure 100a and increasing data transfer rate in comparison with traditional package structures. Further, the formation of the electrical extension structure 130 may make the electronic component 140 and the conductive terminal 180 be at different horizontal levels, simplifying the molding process. In traditional package structures, in order to encapsulate an electronic component and prevent solders from being encapsulated by an encapsulant, a customized mold chase is required and increases production cost. In the present disclosure, no customized mold chase is required to avoid the encapsulation of conductive terminals 180 at the surface 110s1 of the carrier 110. The electrical extension structure 130 extends the conductive terminals 180 further away from the carrier 110 to a lower level of the semiconductor package structure 100a that is not laterally overlapped with electronic components 140. The portions of the encapsulant 170 encapsulating the electronic component 140 and the electrical extension structure 130 have a substantially coplanar surface.

Figure 2:
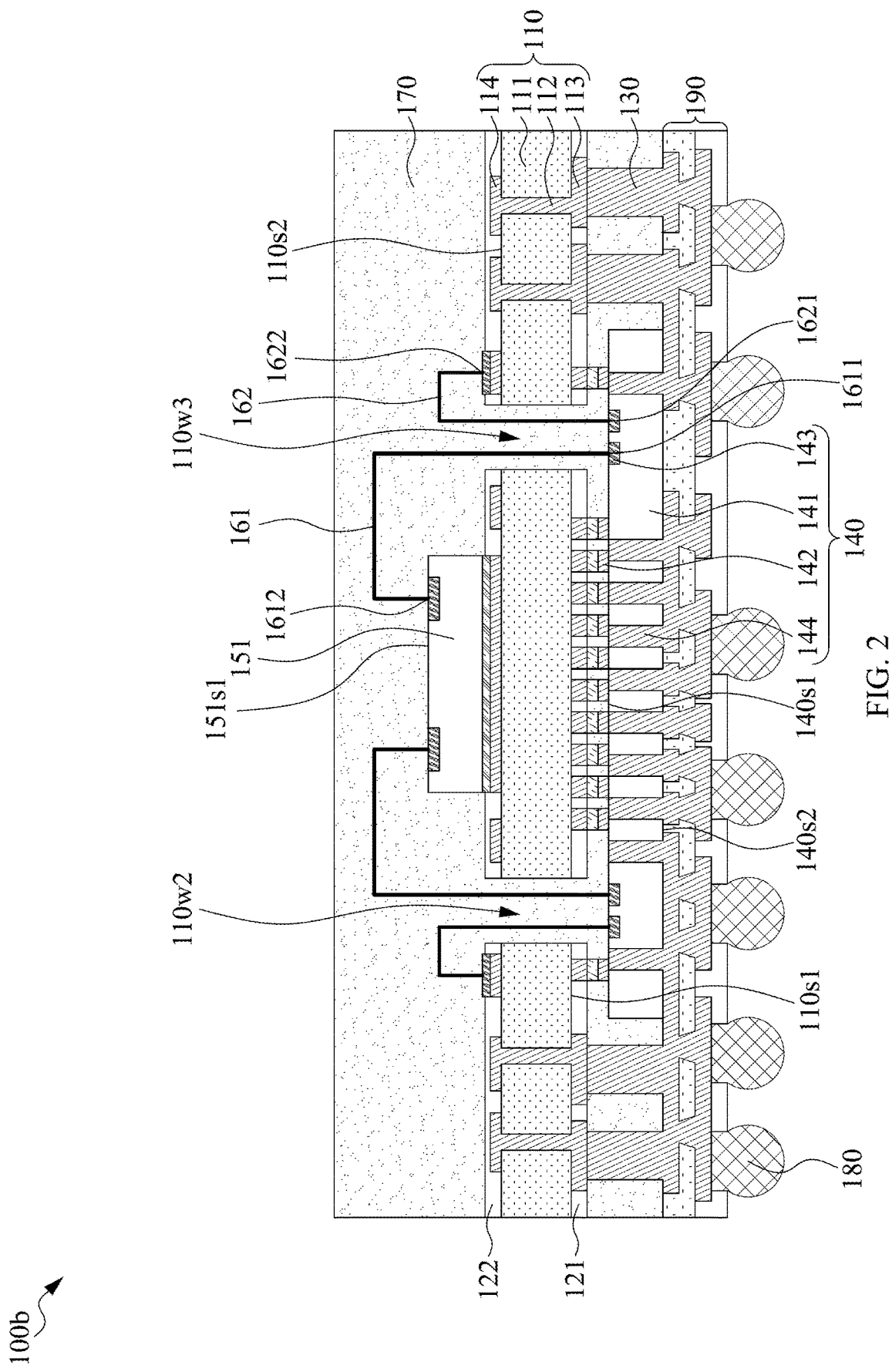
FIG. 2 illustrates a cross-sectional view of an example of a semiconductor package structure according to some embodiments of the present disclosure.

FIG. 2 illustrates a cross-sectional view of an example of a semiconductor package structure 100b according to some embodiments of the present disclosure. The semiconductor package structure 100b of FIG. 2 may have a structure similar to that of the semiconductor package structure 100a of FIG. 1B, except that the semiconductor package structure 100b may further include a redistribution structure 190 on the face 110s1 of the carrier 110. In some embodiments, the semiconductor package structure 100b is an electronic package.

The redistribution structure 190 may be disposed between the electrical extension structure 130 and the conductive terminal 180. The redistribution structure 190 may be electrically connected to the electrical extension structure 130 and the electronic component 140. The redistribution structure 190 may include at least one dielectric layer, and trace(s) and conductive via(s) embedded in the dielectric layer. In some embodiments, the redistribution structure 190 is stacked with the electrical extension structure 130, the electronic component 140, and the encapsulant 170. Further, the electronic component 140 may include through vias 144 (e.g., through silicon via, TSV) extending between the active surface 140s1 and the backside surface 140s2. In some embodiments, the electronic component 140 is electrically connecting the carrier 110 and the redistribution structure 190 via the through vias 144. The through via 144 and the redistribution structure 190 may assist in reducing the length of conductive path between the carrier 110 and the conductive terminal 180, thereby increasing the speed of signal transmission. Although FIG. 2 illustrates that only one electronic component 151 is disposed on the face 110s2 of the carrier 110 on a predetermined cross section, it should be noted that the number of electronic components on said predetermined cross section can be modified depending on requirements.

Figure 3:
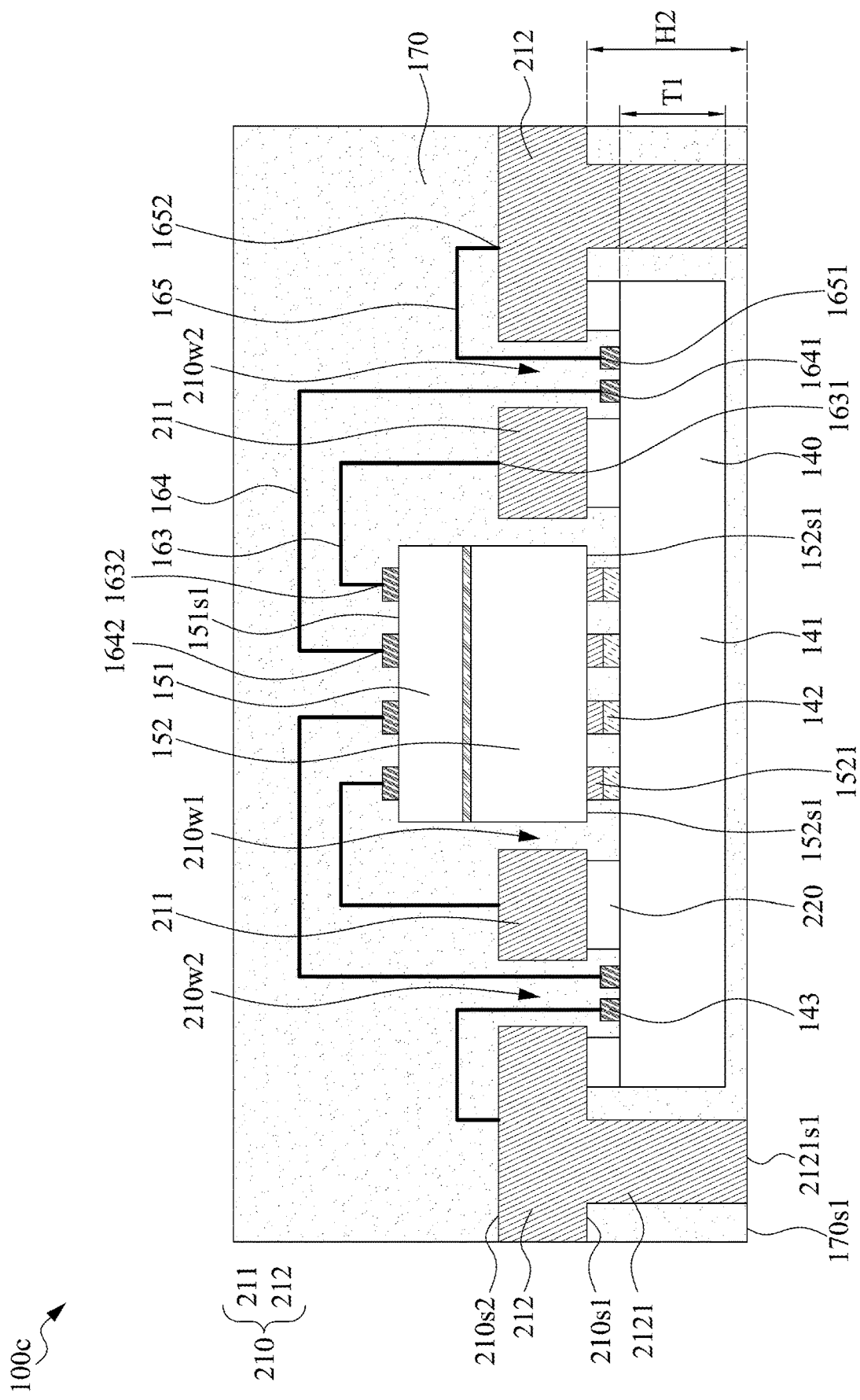
FIG. 3 illustrates a cross-sectional view of an example of a semiconductor package structure according to some embodiments of the present disclosure.

FIG. 3 illustrates a cross-sectional view of an example of a semiconductor package structure 100c according to some embodiments of the present disclosure. The semiconductor package structure 100c of FIG. 3 may have a structure similar to that of the semiconductor package structure 100a of FIG. 1B, except that the carrier 110 may be replaced by the carrier 210. In some embodiments, the semiconductor package structure 100c is an electronic package.

In some embodiments, the carrier 210 may include a lead frame. The lead frame may include copper, copper alloy or another suitable metal or alloy. In some embodiments, the carrier 210 may include one of, or a combination of the following: iron/iron alloy, nickel/nickel alloy, or any other metal/metal alloy. The carrier 210 may have a surface 210s1 and a surface 210s2 opposite to the surface 210s1. The carrier 210 may include a die paddle 211 and a lead 212 around the die paddle 211. The space defined by the die paddle 211, the lead 212, and the electrical extension structure 2121 may be configured to accommodate one or more electronic components, such as the electronic component 140. In some embodiments, the electronic component 140 may be attached to the surface 210s1 of the carrier 210 through an adhesive 220. In some embodiments, the die paddle 211 may define an opening 210w1 connecting the surface 210s1 and the surface 210s2 of the carrier 210. The opening 210w1 may be located on a die paddle 211 of a lead frame. In some embodiments, the electronic components 151 and 152 may be stacked vertically. The active surface 151s1 of the electronic component 151 may face away from the electronic component 140. The active surface 152s1 of the electronic component 152 may face the electronic component 140. The electronic component 152 may be electrically connected to the electronic component 140 via terminals 1521. In some embodiments, at least one of the electronic components 151 and 152 may be disposed within the opening 210w1 of the carrier 210. In some embodiments, the electronic component 140 and the electronic components 151 and 152 are vertically aligned to each other.

The lead 212 may surround the die paddle 211. The die paddle 211 and the lead 212 may collaboratively define an opening 210w2 connecting the surface 210s1 and the surface 210s2 of the carrier 210. The carrier 210 may include electrical extension structures 2121 protruding from the surface 210s1 of the carrier 210. The electrical extension structure 2121 may be disposed on the lead 212. The electrical extension structure 2121 may have a thickness H2. In some embodiments, the thickness H2 is greater than the thickness T1 of the electronic component 140. The electrical extension structure 2121 may have a surface 2121s1 exposed from the encapsulant 170. In some embodiments, the surface 2121s1 of the electrical extension structure 2121 is substantially coplanar with the surface 170s1 of the encapsulant 170.

The semiconductor package structure 100c may include bonding wires 163, 164 and 165. The bonding wire 163 may electrically connect the electronic component 151 and the die paddle 211 of the carrier 210. The bonding wire 163 may include an end 1631 bonded to the die paddle 211 of the carrier 210 and an end 1632 bonded to the electronic component 151. The bonding wire 164 may electrically connect the electronic component 151 and the electronic component 140. The bonding wire 164 may include an end 1641 bonded to the electronic component 140 and an end 1642 bonded to the electronic component 151. The bonding wire 165 may electrically connect the electronic component 140 and the lead 212 of the carrier 210. The bonding wire 165 may include an end 1651 bonded to the electronic component 140 and an end 1652 bonded to the lead 212 of the carrier 210. In some embodiments, the bonding wire 164 may pass the opening 210w2. In some embodiments, the bonding wire 165 may pass the opening 210w2.

In the embodiments of the present disclosure, the die paddle 211 of the carrier 210 define an opening 210w1 for accommodating electronic components (e.g., the electronic components 151 and 152), and thus the thickness of the entire semiconductor package structure 100c may decrease. Further, the semiconductor package structure 100c includes the bonding wires 164 and 165 passing the opening 210w2 defined by the die paddle 211 and the lead 212 of the carrier 210. The bonding wires 163, 164 and 165 may provide a connection between electronic components 151 and 140 or between the carrier 210 and the electronic component 140, thereby increasing the speed of signal transmission. Furthermore, no customized mold chase is required to avoid the encapsulation of conductive terminals at the surface 210s1 of the carrier 210. The electrical extension structure 2121 extends the conductive terminals (not illustrated in FIG. 3) to a lower level of the semiconductor package structure 100c that is not laterally overlapped with electronic components 140. The electrical extension structure 2121 may be used to, for example, connect the carrier 210 with an external electronic component (not shown).

Figure 4:
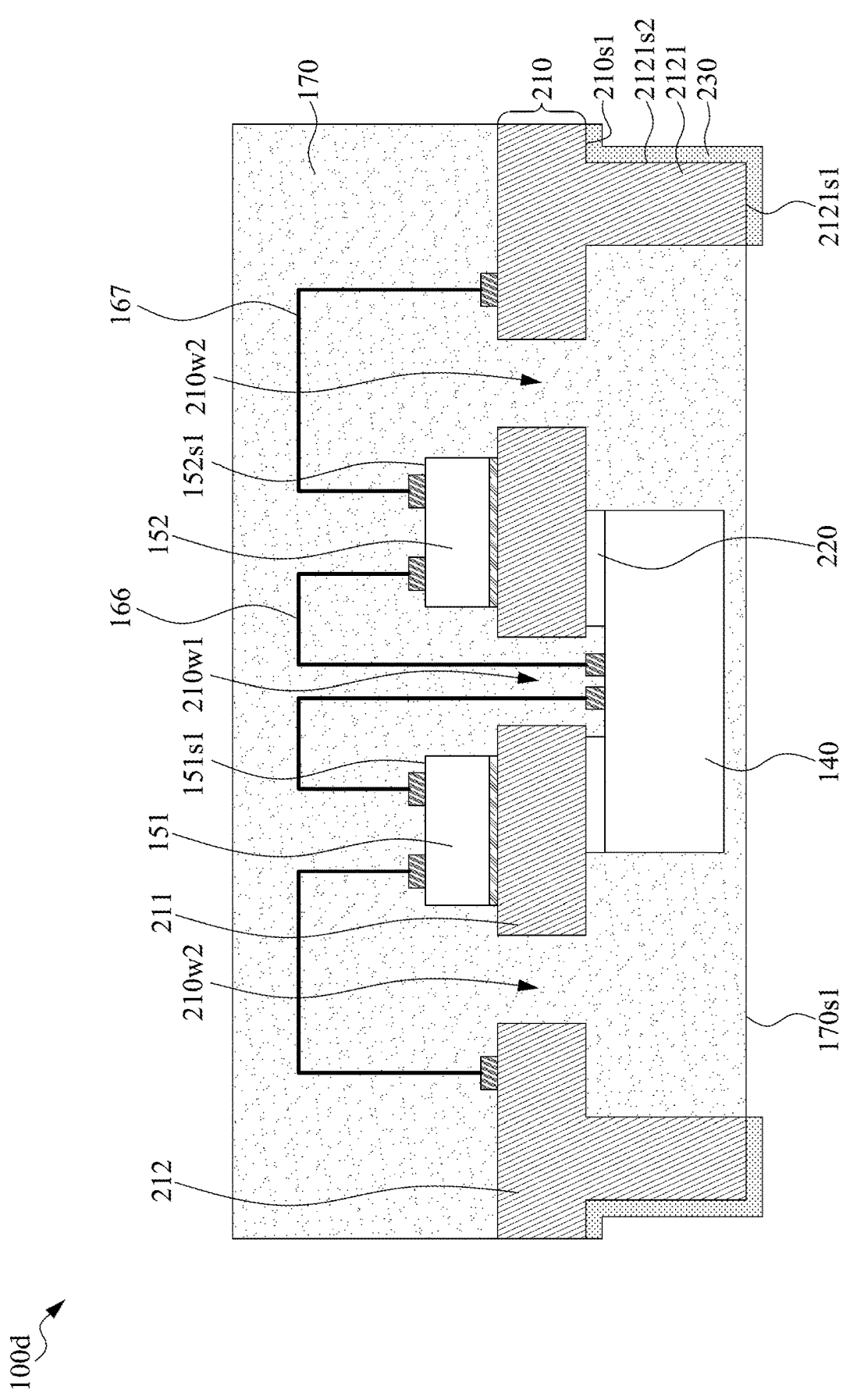
FIG. 4 illustrates a cross-sectional view of an example of a semiconductor package structure according to some embodiments of the present disclosure.

FIG. 4 illustrates a cross-sectional view of an example of a semiconductor package structure 100d according to some embodiments of the present disclosure. The semiconductor package structure 100d of FIG. 4 may have a structure similar to that of the semiconductor package structure 100c of FIG. 3, except that the semiconductor package structure 100d further includes a conductive protection layer 230 disposed on the electrical extension structure 2121. In some embodiments, the semiconductor package structure 100d is an electronic package.

In some embodiments, the electronic components 151 and 152 may be disposed on the die paddle 211 of the carrier 210. The electrical extension structure 2121 may have a surface 2121s2 extending between the surface 210s1 of the carrier 210 and the surface 2121s1 of the electrical extension structure 2121. In some embodiments, the surface 2121s2 of the electrical extension structure 2121 may be exposed from the encapsulant 170 and configured as a wettable flank. In some embodiments, the conductive protection layer 230 may be disposed on the surface 2121s1 and surface 2121s2 of the electrical extension structure 2121 as well as on the surface 210s1 of the carrier 210.

The semiconductor package structure 100d may further include bonding wires 166 and 167. The bonding wire 166 may electrically connect the electronic components 140 and 151 (or 152). The bonding wire 166 may pass the opening 210w1 of the die paddle 211. The bonding wire 167 may electrically connect the lead 212 of the carrier 210 and the electronic component 151 (or 152). In some embodiments, the electronic components 140 may overlap the opening 210w1 in an aspect vertical to the face 210s1 or 210s2.

In the embodiments of the present disclosure, the carrier 210 defines the opening 210w1 through which the bonding wire 166 passes. The bonding wire 166 may electrically connect two electronic components 140 and 151 (or 152) on two opposite sides of the carrier 210 via the opening 210w1, reducing the thickness of the semiconductor package structure 100d and increasing the data transfer rate in comparison with traditional package structures.

FIGS. 5A, 5B, 5C, 5D and 5E illustrate various stages of an example of a method for manufacturing a semiconductor package structure 100a according to some embodiments of the present disclosure.

Figure 5A:
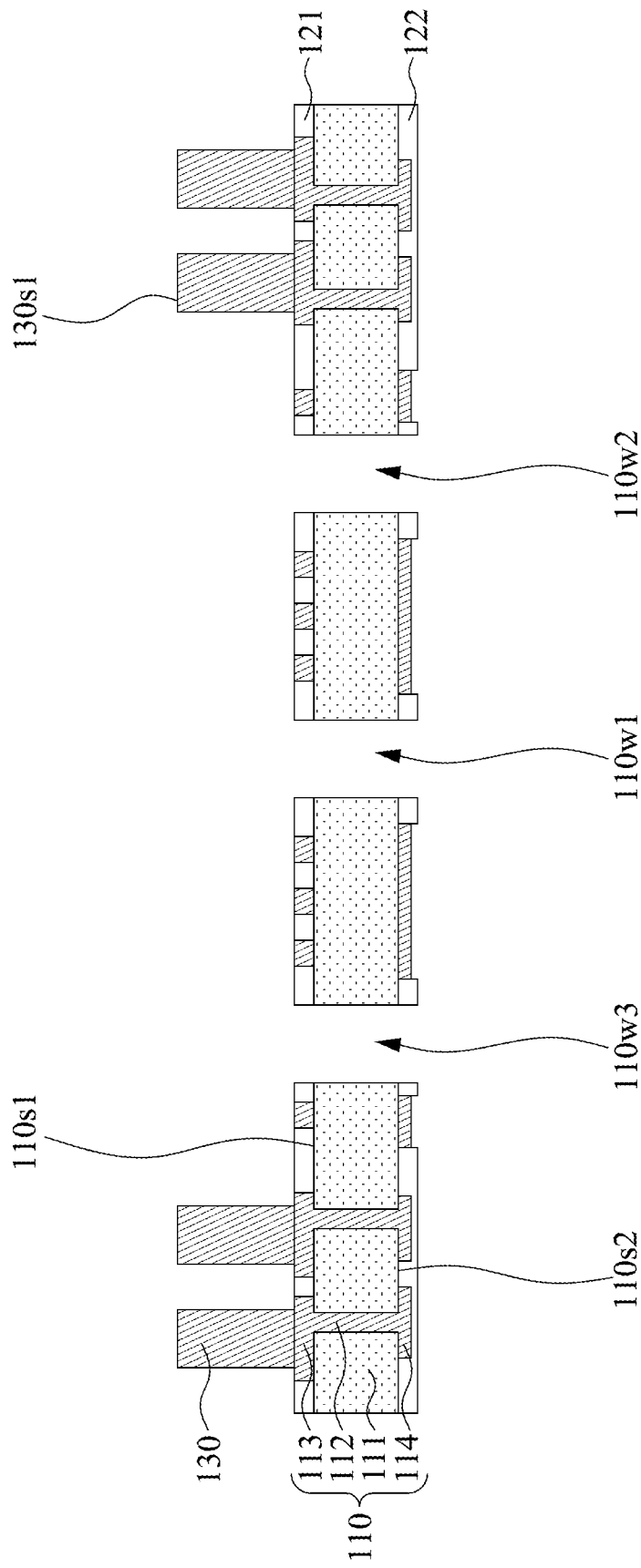
FIGS. 5A, 5B, 5C, 5D and 5E illustrate various stages of an example of a method for manufacturing a semiconductor package structure according to some embodiments of the present disclosure.

Referring to FIG. 5A, an electrical extension structure 130 is provided on a face 110s1 of a carrier 110. The electrical extension structure 130 may be formed by a sputtering operation, an electroplating operation, and a photolithography operation. For example, forming the electrical extension structure 130 may include forming a patterned photosensitive layer (not shown) on the face 110s1 of the carrier 110 by a photolithography operation, forming a seed layer on the openings of the patterned photosensitive layer by a sputtering operation, forming a conductive pillar on the seed layer by an electroplating operation, and removing the patterned photosensitive layer. The carrier 110 may then form openings 110w1, 110w2, and 110w3 connecting the faces 110s1 and 110s2 of the carrier 110. In some embodiments, the openings 110w1, 110w2, and 110w3 may be formed by, for example, a laser ablation, or a punching operation.

Figure 5B:
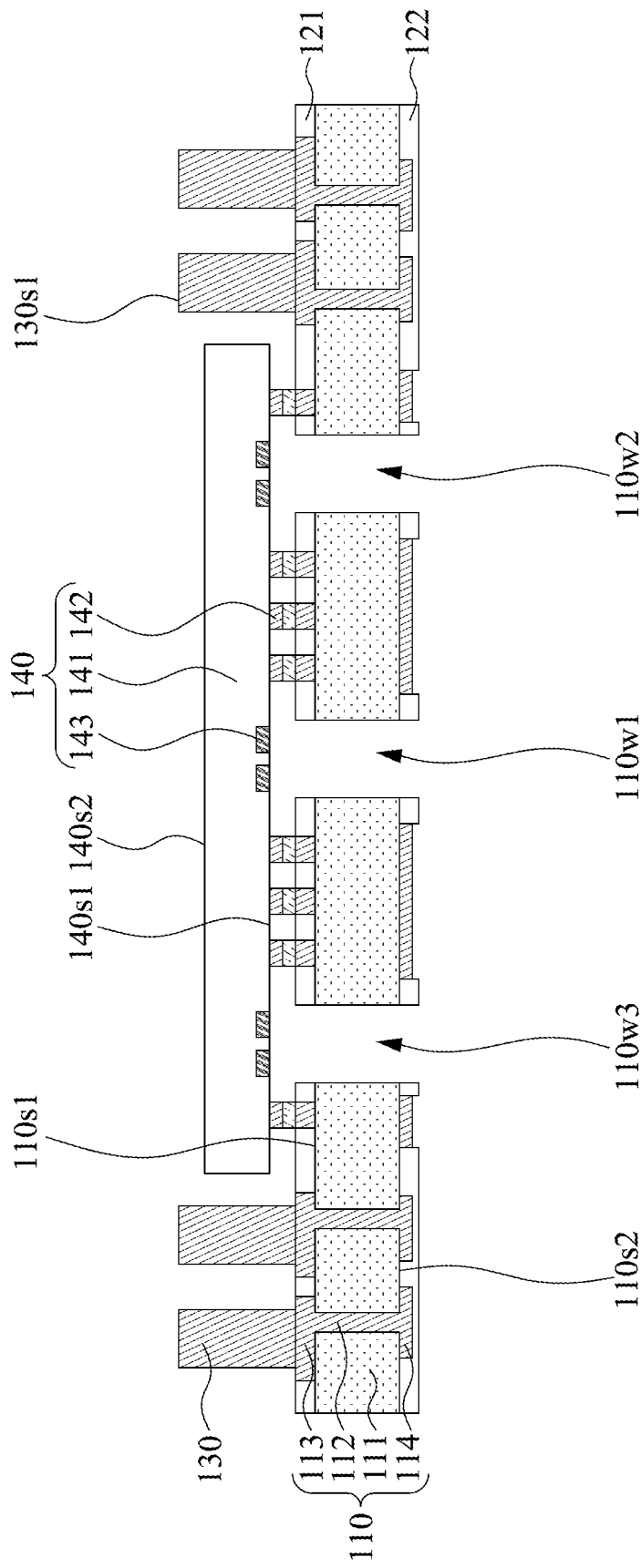

Referring to FIG. 5B, an electronic component 140 is attached to the face 110s1 of the carrier 110. In some embodiments, the electronic component 140 may be attached to the carrier 110 through a flip-chip operation.

Figure 5C:
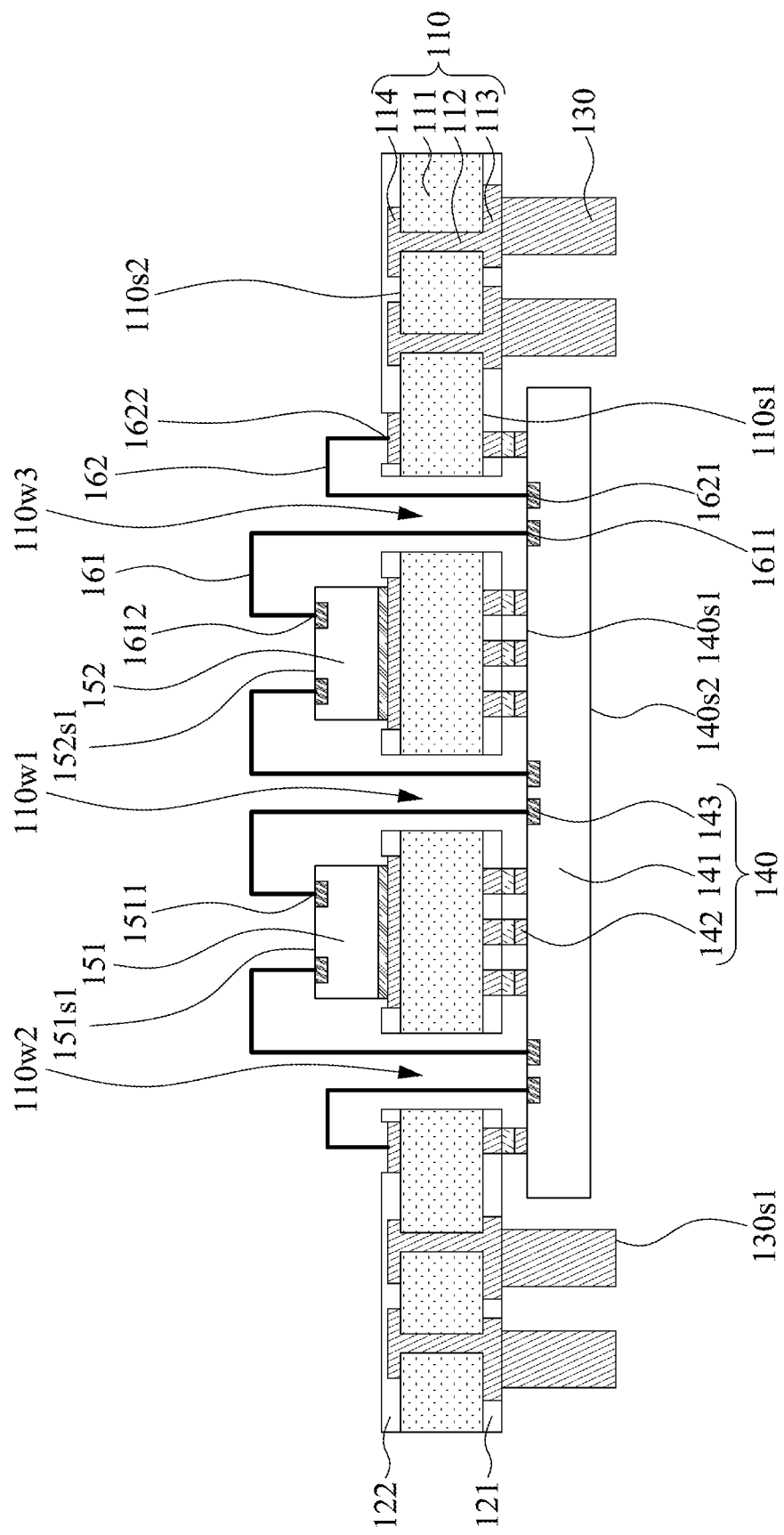

Referring to FIG. 5C, electronic components 151 and 152 are attached to the face 110s2 of the carrier 110. Further, bonding wires 161 and 162 are formed to electrically connect the electronic component 151 (or 152) and the electronic component 140 or electrically connect the carrier 110 and the electronic component 140 through opening 110w1, 110w2 or 110w3 of the carrier 110. Multiple bonding wires 161, 162 may pass through a single opening 110w2 or 110w3, for example. FIG. 5C shows a hybrid die structure where the electronic components 151 and 152 are wire bonded and the electronic component 140 is flip-chip bonded.

Figure 5D:
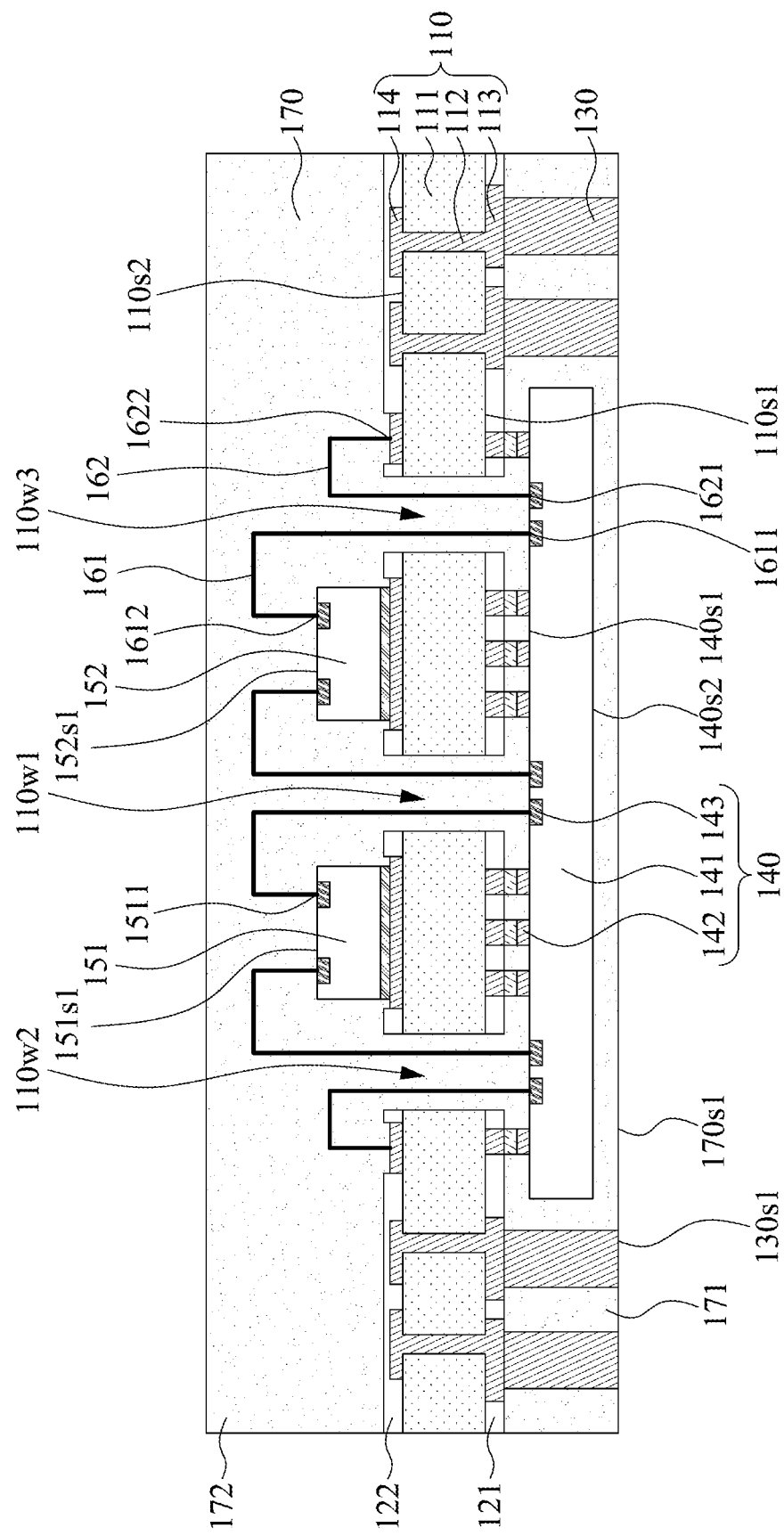

Referring to FIG. 5D, an encapsulant 170 is formed to encapsulate the electronic components 140, 151, and 152, the bonding wires 161 and 162 as well as the electrical extension structure 130 by a molding operation. The mold flow can be applied from the face 110s2 of the carrier 110, and through the multiple openings 110w1, 110w2, 110w3, the molding material enters the face 110s1 of the carrier 110 and further molding both sides of the carrier 110 and the components thereon.

Figure 5E:
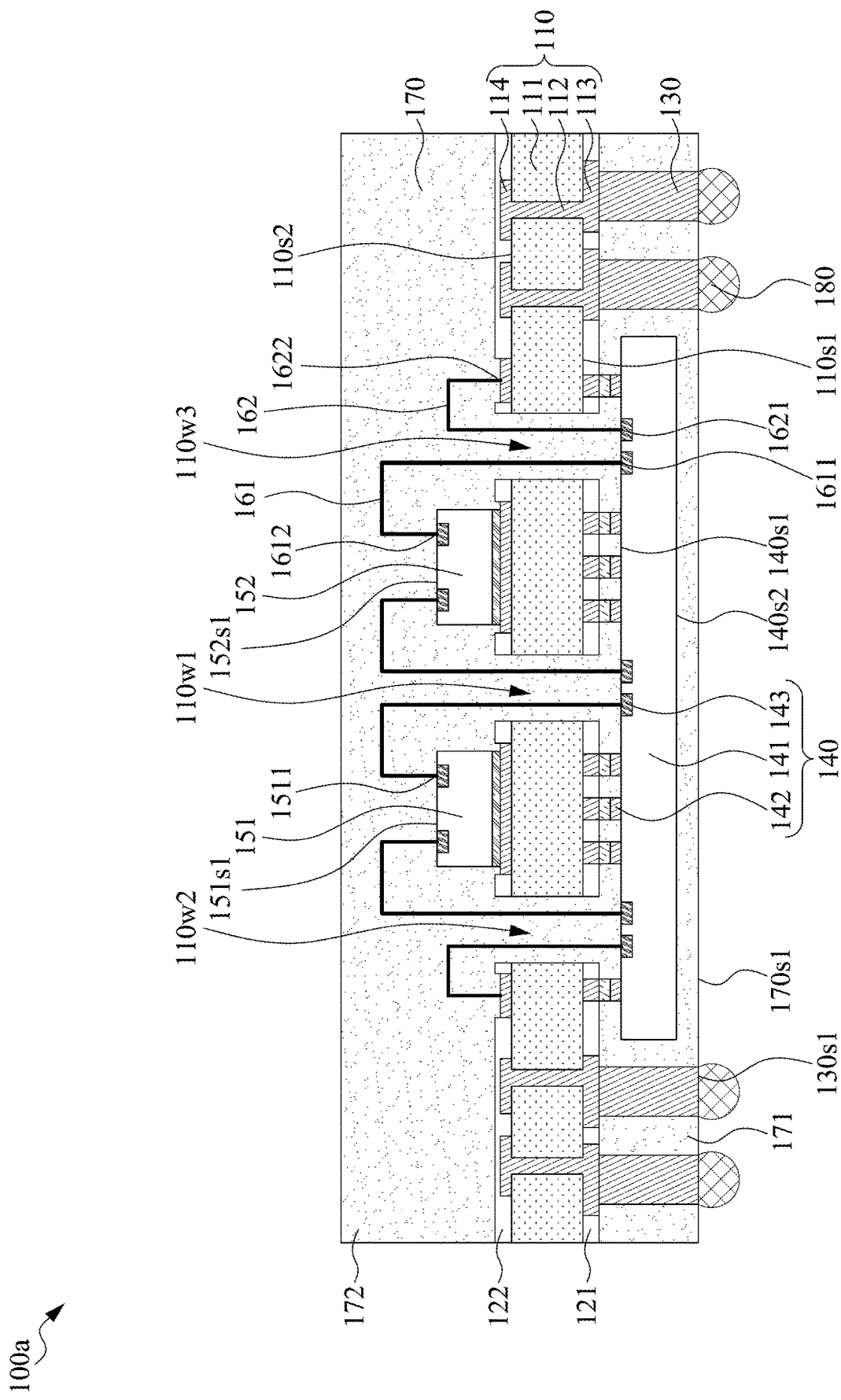

Referring to FIG. 5E, a conductive terminal 180 is formed to connect the electrical extension structure 130 after encapsulating the electronic component 140 and the electrical extension structure 130, and a semiconductor package structure 100a is produced. In the embodiments of the present disclosure, the encapsulant 170 is formed prior to the formation of the conductive terminal 180. Therefore, during a molding operation, a general mold chase can be used to encapsulate the electronic component 140 and the electrical extension structure 130. Unlike the manufacturing of conventional package structures, a customized mold chase is needed to prevent solders (or the conductive terminal) from being encapsulated during a molding operation. As a result, the cost of manufacturing the semiconductor package structure 100a is reduced.

FIGS. 6A, 6B, 6C, 6D, and 6E illustrate various stages of an example of a method for manufacturing a semiconductor package structure 100d according to some embodiments of the present disclosure.

Figure 6A:
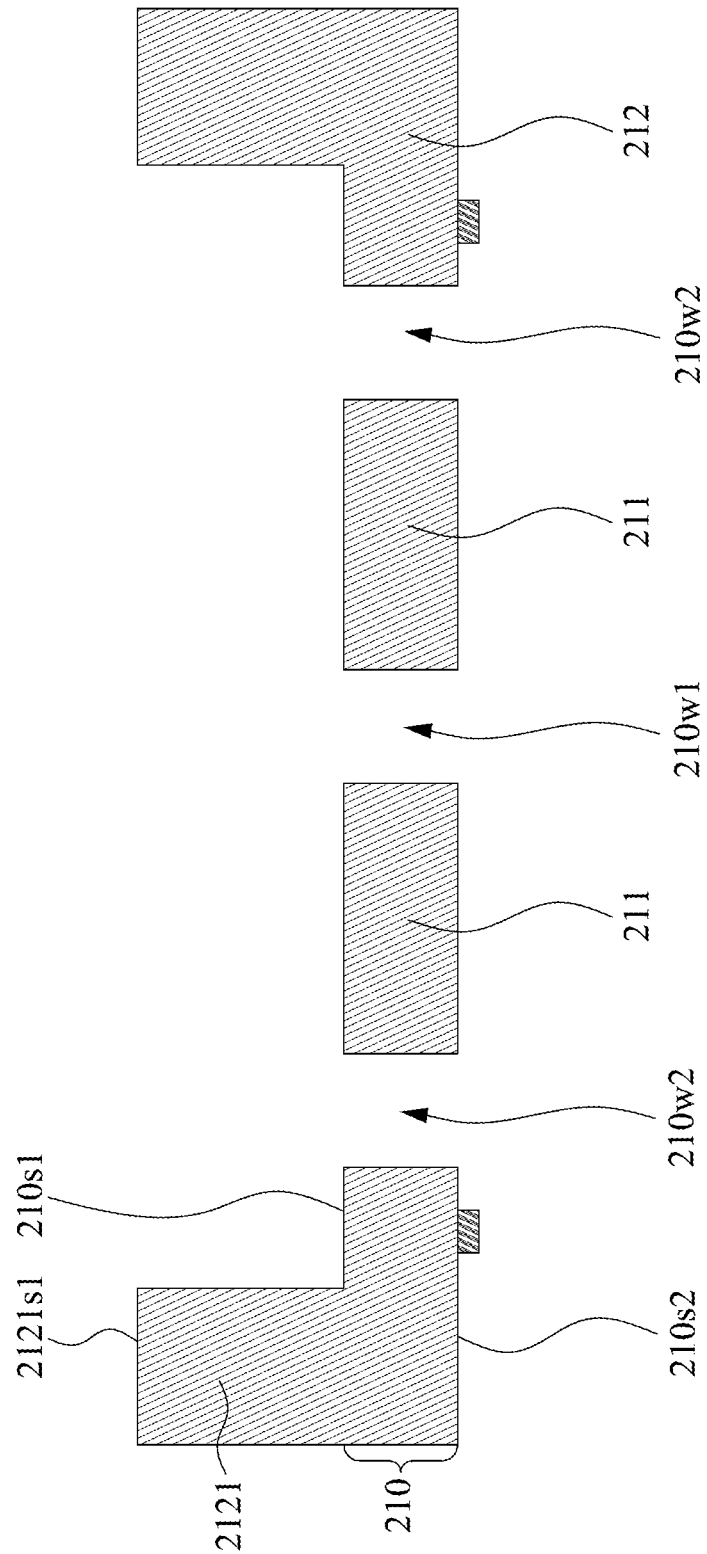
FIGS. 6A, 6B, 6C, 6D, and 6E illustrate various stages of an example of a method for manufacturing a semiconductor package structure according to some embodiments of the present disclosure.

Referring to FIG. 6A, a carrier 210, including a die paddle 211 and a lead 212 around the die paddle 211, is provided. The carrier 210 has a surface 210s1 and a surface 210s2 opposite to the surface 210s1. The electrical extension structure 2121 is formed on the surface 210s1 of the carrier 210. In some embodiments, the electrical extension structure 2121 is formed by a half etch operation from the surface 2121s1 of the lead 212 of the carrier 210 to form a lead pin serving as the electrical extension structure 2121. Further, another half etch operation may be performed from the die paddle 211 of the carrier 210 to form an opening 210w1.

Figure 6B:
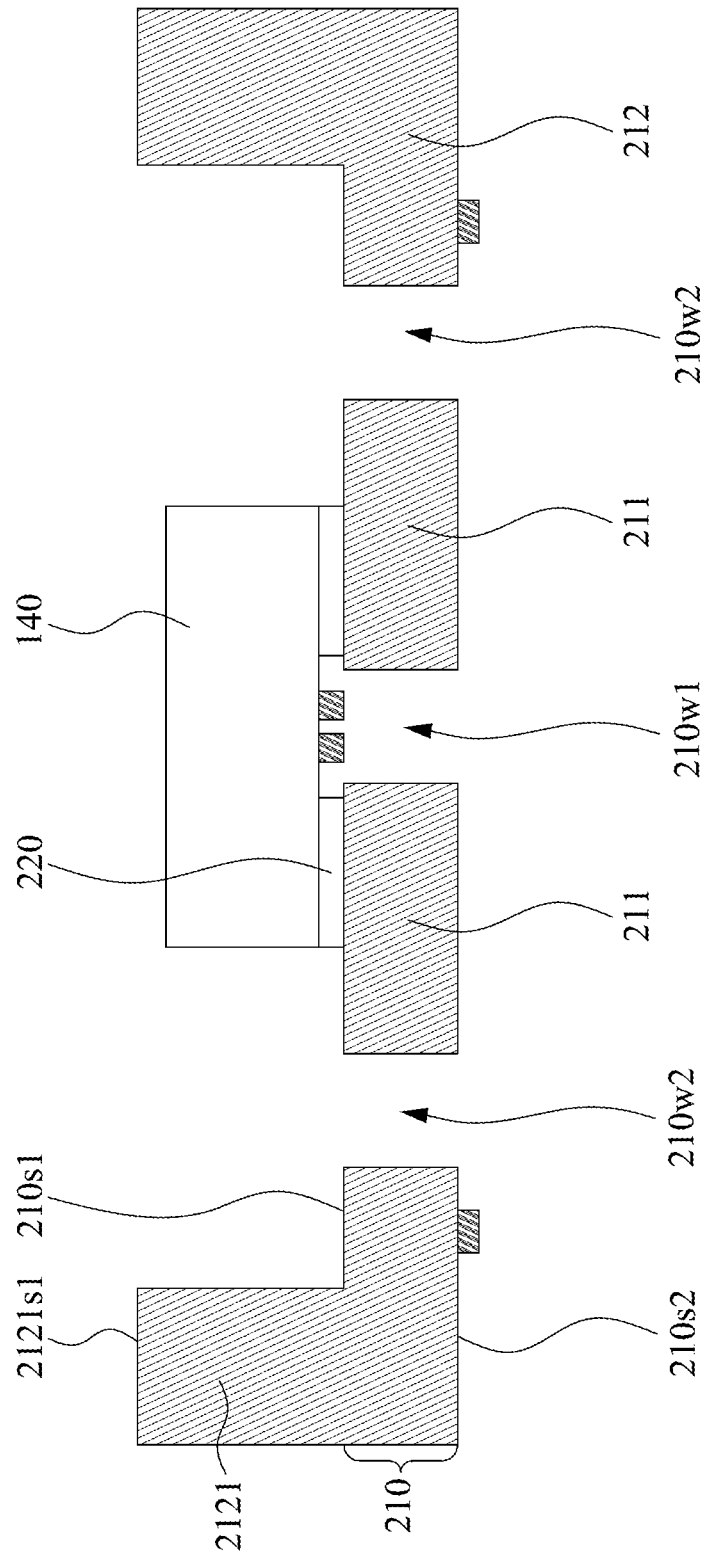

Referring to FIG. 6B, an electronic component 140 is attached to the die paddle 211 or the surface 210s1 of the carrier 210 through an adhesive 220. The electronic component 140 may be vertically overlapping one of the openings, here exemplified as the opening 210w1.

Figure 6C:
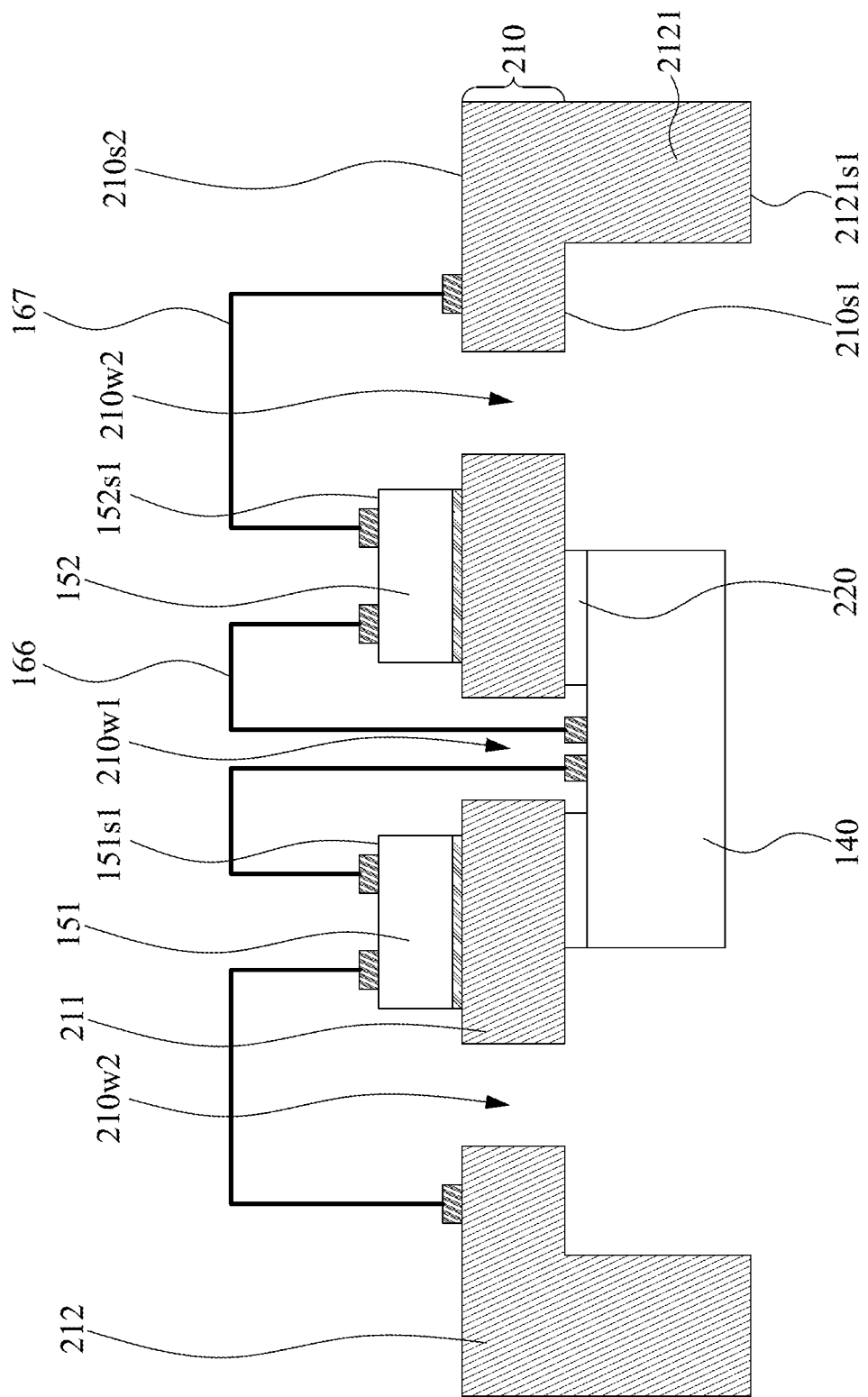

Referring to FIG. 6C, electronic components 151 and 152 are attached to the die paddle 211 and to the face 210s2 of the carrier 210. Further, bonding wires 166 and 167 are formed to electrically connect the electronic component 151 (or 152) and the electronic component 140 or connect the carrier 210 and the electronic component 151 (or 152). The bonding wire 166 may pass through the opening 210w1 of the die paddle 211. In some embodiments, one or more bonding wires 166 may pass through one of the openings 210w1, 210w2 of the carrier 210.

Figure 6D:
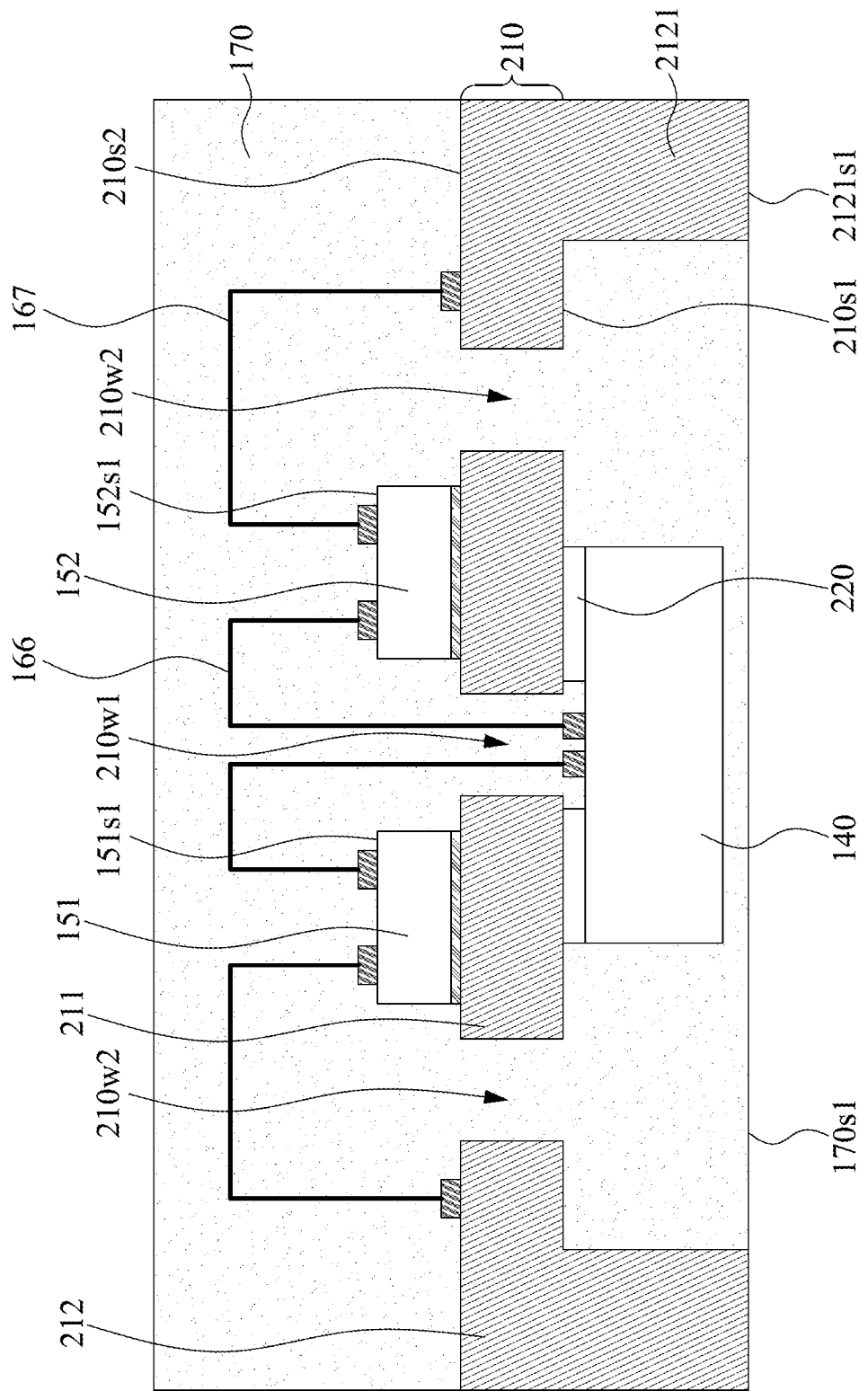

Referring to FIG. 6D, an encapsulant 170 is formed to encapsulate the electronic component 140, electronic component 151, electronic component 152, the bonding wire 166, bonding wire 167 and the electrical extension structure 2121 by a molding operation. The mold flow can be applied from the face 210s2 of the carrier 210, and through the multiple openings 210w1, 210w2, the molding material enters the face 210s1 of the carrier 210 and further molding both sides of the carrier 210 and the components thereon.

Figure 6E:
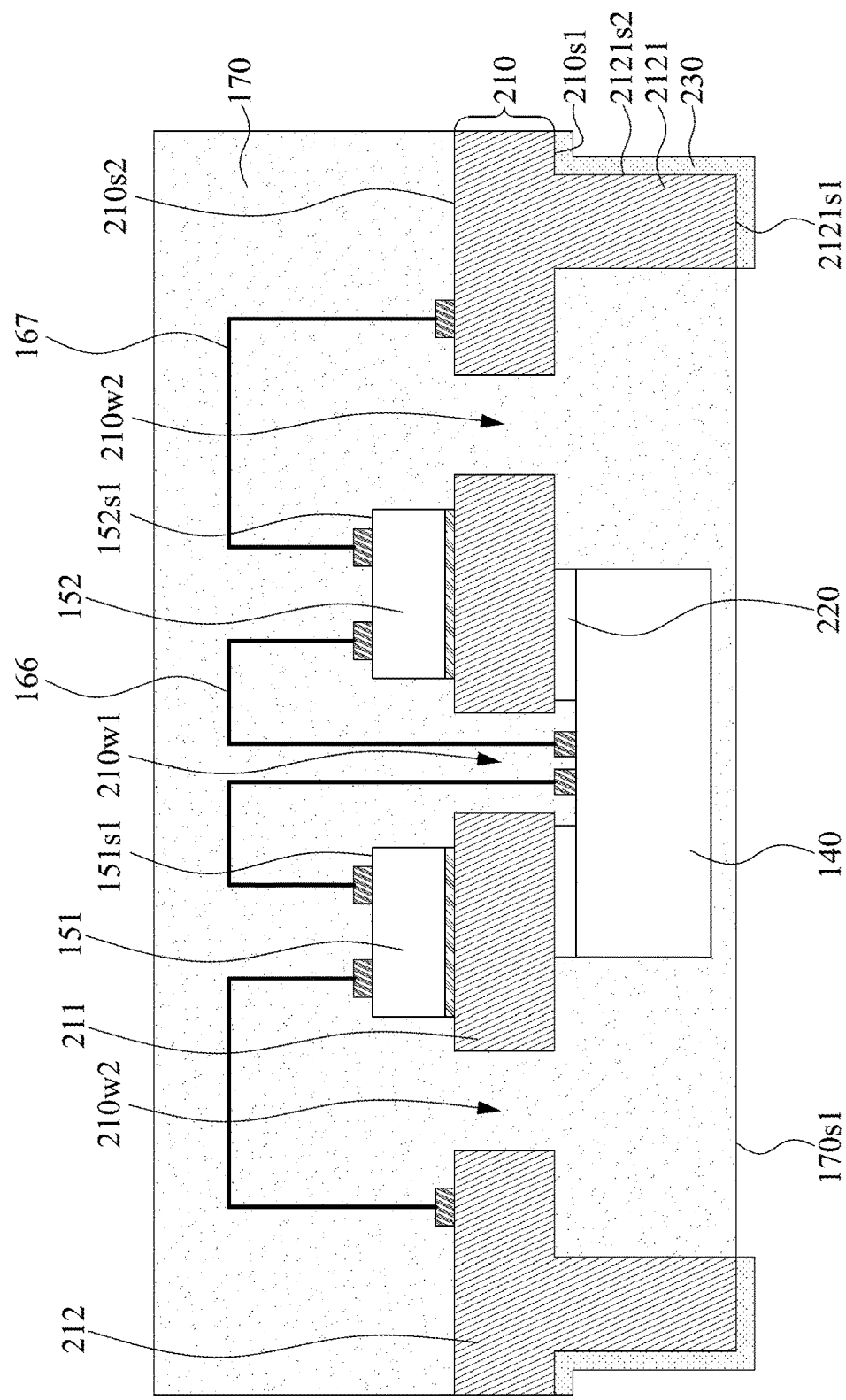

Referring to FIG. 6E, FIG. 6E is an optional operation. A half cut operation may be performed on the electrical extension structure 2121 to remove a portion of the electrical extension structure 2121. As a result, a surface 2121s2 is formed and exposed from the encapsulant 170, and a portion of the surface 210s1 is exposed from the encapsulant 170 after the half cut operation is performed. Next, a conductive protection layer 230 is formed on the electrical extension structure 2121 and serving as a wettable flank, and a semiconductor package structure 100d is produced. The semiconductor package structure 100d with an optional wettable flank is suitable for high reliability applications such as automotive electronics.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of the embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, subdivided, or reordered to form an equivalent method without departing from the teachings of the present disclosure. Accordingly, unless specifically indicated herein, the order and grouping of the operations are not limitations of the present disclosure.

What is claimed is:

1. An electronic package, comprising:
   a carrier having a first face and a second face opposite to the first face;
   a first electronic component adjacent to the first face of the carrier;
   an electrical extension structure adjacent to the first face of the carrier and defining a space with the carrier for accommodating the first electronic component, wherein the electrical extension structure is configured to connect the carrier with an external electronic component; and
   an encapsulant encapsulating the first electronic component and at least a portion of the electrical extension structure,
   wherein the carrier comprises a first opening connecting the first face and the second face, and a first type bonding wire passes through the first opening and connects to the first electronic component.

2. The electronic package of claim 1, further comprising:
   a second electronic component adjacent to the second face of the carrier, wherein the first type bonding wire connects the first electronic component and the second electronic component.

3. The electronic package of claim 2, further comprising:
   a second type bonding wire passing through the first opening and connecting the first electronic component with the carrier,
   wherein the first type bonding wire comprises a plurality of bonding wires, and the second type bonding wire comprises a plurality of bonding wires.

4. The electronic package of claim 1, wherein a side surface of the electrical extension structure is exposed from the encapsulant and configured as a wettable flank.

5. The electronic package of claim 1, further comprising:
   a second electronic component and a third electronic component disposed within the first opening of the carrier, wherein the first electronic component, the second electronic component and the third electronic component are vertically overlapped to each other.

6. The electronic package of claim 5, wherein the first electronic component has a first terminal over an active surface of the first electronic component, the second electronic component has a second terminal proximal to an active surface of the second electronic component, and the first terminal is connected to the second terminal.

7. The electronic package of claim 1, further comprising:
a second electronic component adjacent to the second face of the carrier,
wherein the first type bonding wire electrically connects the first electronic component with the second electronic component, a first end of the first type bonding wire bonded to the first electronic component, and a second end of the first type bonding wire bonded to the second electronic component.

8. The electronic package of claim 1, wherein a portion of the encapsulant is disposed in the first opening.

9. The electronic package of claim 1, wherein the electrical extension structure has a first surface spaced apart from the first face of the carrier, and the encapsulant has a surface substantially aligned with the first surface of the electrical extension structure.

10. The electronic package of claim 9, wherein the electrical extension structure has a second surface extending between the first face of the carrier and the first surface of the electrical extension structure, and the second surface of the electrical extension structure is exposed by the encapsulant.

11. The electronic package of claim 1, wherein the carrier further comprises:
a second opening connecting the first face and the second face, wherein the second opening is located between a second electronic component and a third electronic component, and a third type bonding wire passes through the second opening and connects the first electronic component and the second electronic component.

12. A semiconductor package structure, comprising:
a carrier having a first face and a second face opposite to the first face, the first face being configured to connect the carrier with an external circuit structure;
a first electronic component adjacent to the first face of the carrier;
a second electronic component adjacent to the second face of the carrier;
a first opening in the carrier, connecting the first face and the second face;
a first bonding wire passing through the first opening and having a first end bonded to the first electronic component and a second end bonded to the second electronic component; and
a second bonding wire passing through the first opening and having a first end bonded to the first electronic component and a second end bonded to the carrier.

13. The semiconductor package structure of claim 12, further comprising:
a second opening in the carrier, connecting the first face and the second face;
a third bonding wire passing through the second opening and having a first end bonded to the first electronic component and a second end bonded to the second electronic component; and
a fourth bonding wire passing through the second opening and having a first end bonded to the first electronic component and a second end bonded to the carrier.

14. The semiconductor package structure of claim 12, further comprising:
a plurality of conductive pillars at the first face of the carrier and around the first electronic component; and
an encapsulant encapsulating the first electronic component and the plurality of conductive pillars,
wherein a height of at least one of the plurality of conductive pillars is greater than a thickness of the first electronic component.

15. The semiconductor package structure of claim 14, further comprising:
a redistribution structure stacked with the plurality of conductive pillars, the first electronic component, and the encapsulant, wherein the first electronic component is electrically connecting the carrier and the redistribution layer via a through via which is embedded within the first electronic component.

16. The semiconductor package structure of claim 14, further comprising:
a conductive terminal connected to the plurality of conductive pillars, wherein the conductive terminal does not overlap the first electronic component in plain view.

17. The semiconductor package structure of claim 14, wherein the encapsulant comprises a first portion encapsulating the first electronic component and the plurality of conductive pillars and a second portion encapsulating the second electronic component, and wherein a width of the first portion is substantially equal to that of the second portion.

18. A method of manufacturing a semiconductor package structure, comprising:
providing a carrier having a first face and a second face opposite to the first face, the carrier defining a first opening connecting the first face and the second face of the carrier;
forming an electrical extension structure at the first face of the carrier;
attaching a first electronic component adjacent to the first face of the carrier;
encapsulating the first electronic component and the electrical extension structure by a molding operation;
attaching a second electronic component adjacent to the second face of the carrier; and
forming a first bonding wire having a first end bonded to the first electronic component and a second end bonded to the second electronic component, wherein the first bonding wire passes through the first opening of the carrier.

19. The method of manufacturing a semiconductor package structure of claim 18, further comprising:
connecting the carrier to an external circuit structure after encapsulating the first electronic component and the electrical extension structure.

20. The method of manufacturing a semiconductor package structure of claim 18, further comprising:
forming a second opening connecting the first face and the second face of the carrier;
attaching a third electronic component adjacent to the second face of the carrier;
forming a second bonding wire to connect the first electronic component and the third electronic component, wherein the second bonding wire passes through the second opening; and forming a third bonding wire to connect the carrier and the third electronic component, wherein the third bonding wire passes through the second opening.

\* \* \* \* \*